United States Patent
Lee et al.

(10) Patent No.: US 12,334,318 B2
(45) Date of Patent: Jun. 17, 2025

(54) PLASMA PRECLEAN SYSTEM FOR CLUSTER TOOL

(71) Applicant: Applied Materials, Inc., Santa Clara, CA (US)

(72) Inventors: Songjae Lee, San Jose, CA (US); Masato Ishii, Sunnyvale, CA (US); Martin Truemper, Austin, TX (US); Richard O. Collins, Santa Clara, CA (US); Martin Jeffrey Salinas, San Jose, CA (US); Yong Zheng, Dublin, CA (US); Anita Zhao, Sunnyvale, CA (US); Adele Mariadass, Reno, NV (US); Christophe Marcadal, Santa Clara, CA (US); Henry Barandica, San Jose, CA (US); Ernesto J. Ulloa, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 17/836,657

(22) Filed: Jun. 9, 2022

(65) Prior Publication Data
US 2023/0402268 A1  Dec. 14, 2023

(51) Int. Cl.
*H01J 37/32* (2006.01)

(52) U.S. Cl.
CPC .... *H01J 37/32816* (2013.01); *H01J 37/3244* (2013.01); *H01J 37/32449* (2013.01);
(Continued)

(58) Field of Classification Search
CPC ............... H01J 37/32091; H01J 37/321; H01J 37/32357; H01J 37/3244; H01J 37/32449;
(Continued)

(56) References Cited

U.S. PATENT DOCUMENTS

| 8,475,674 B2 | 7/2013 | Thadani et al. |
| 8,771,539 B2 | 7/2014 | Zhang et al. |

(Continued)

FOREIGN PATENT DOCUMENTS

KR  10-2019-0108176 A  9/2023

OTHER PUBLICATIONS

International Search Report, dated May 10, 2023, for PCT Application No. PCT/US2023/010414.

*Primary Examiner* — Kurt Sweely
(74) *Attorney, Agent, or Firm* — Patterson + Sheridan, LLP (57) ABSTRACT

A plasma processing system for cleaning a substrate is provided. The plasma processing system includes a process chamber that includes: a chamber body enclosing an interior volume; and a substrate support disposed in the interior volume. The plasma processing system includes a vacuum pump; a first exhaust line fluidly coupled between the interior volume of the process chamber and the vacuum pump; and a second exhaust line fluidly coupled between the interior volume of the process chamber and the vacuum pump. The first exhaust line and the second exhaust line are arranged to provide alternative paths for the exhaust between the interior volume and the vacuum pump, and the first exhaust line has an internal diameter that is at least 50% smaller than the internal diameter of the second exhaust line.

12 Claims, 3 Drawing Sheets

(52) U.S. Cl.
CPC .. *H01J 37/32834* (2013.01); *H01J 37/32899* (2013.01); *H01J 37/32357* (2013.01); *H01J 37/32825* (2013.01)

(58) Field of Classification Search
CPC ........... H01J 37/32816; H01J 37/32825; H01J 37/32834; H01J 37/32844; H01J 37/32853; H01J 37/32862; H01J 37/32871; H01J 37/32899; C23C 16/4408; C23C 16/4412; C23C 16/45561; C23C 16/45565

See application file for complete search history.

(56) References Cited

U.S. PATENT DOCUMENTS

| | | | |
|---|---|---|---|
| 2002/0096495 A1* | 7/2002 | Nguyen | C23C 16/4412 |
| | | | 118/712 |
| 2005/0279731 A1* | 12/2005 | Saito | H01J 37/3244 |
| | | | 257/E21.252 |
| 2008/0286697 A1 | 11/2008 | Verhaverbeke et al. | |
| 2012/0222813 A1* | 9/2012 | Pal | C23C 16/4412 |
| | | | 156/345.31 |
| 2014/0311581 A1 | 10/2014 | Belostotskiy et al. | |
| 2016/0237568 A1 | 8/2016 | Itatani | |
| 2018/0230624 A1 | 8/2018 | Dube et al. | |
| 2019/0017171 A1* | 1/2019 | Kalutarage | C23C 16/52 |
| 2021/0005435 A1* | 1/2021 | Jung | H01J 37/32477 |
| 2021/0040619 A1* | 2/2021 | Yachi | C23C 16/4408 |
| 2021/0043425 A1* | 2/2021 | Sawachi | C23C 16/45544 |
| 2021/0050190 A1 | 2/2021 | Miura et al. | |
| 2022/0108875 A1* | 4/2022 | Thie | H01J 37/32091 |

\* cited by examiner

PLASMA PRECLEAN SYSTEM FOR CLUSTER TOOL

FIELD

Embodiments of the disclosure generally relate to the field of semiconductor manufacturing processes, and more particularly to a plasma preclean system and a cluster tool that includes the plasma preclean system.

BACKGROUND

A cluster tool is often used to perform processes (e.g., a deposition) on a substrate, such as a semiconductor substrate. For some depositions, such as epitaxial depositions, a plasma preclean process can be performed on substrate before the deposition. The plasma preclean process can be performed in one chamber of the cluster tool while the deposition can be performed in another chamber of the cluster tool. The cluster tools that include the deposition chamber and the plasma preclean chamber are generally configured to operate at vacuum pressures, such as pressures less than 10 Torr.

Recently, some epitaxial deposition processes operating at or near atmospheric pressure have been developed, but the plasma preclean process is still performed at a vacuum pressure. Having different portions of a cluster tool operate at substantially different pressures, such as a pressure of 10 Torr and a pressure of 760 Torr, can cause problems, such as the substrate being damaged, when the substrate is transferred between the environments having substantially different pressures.

Therefore, there is a need for methods and corresponding equipment to address the problems described above.

SUMMARY

In one embodiment, a plasma processing system for cleaning a substrate is provided. The plasma processing system includes a process chamber, comprising: a chamber body enclosing an interior volume; and a substrate support disposed in the interior volume. The plasma processing system includes a vacuum pump; a first exhaust line fluidly coupled between the interior volume of the process chamber and the vacuum pump; and a second exhaust line fluidly coupled between the interior volume of the process chamber and the vacuum pump, wherein the first exhaust line and the second exhaust line are arranged to provide alternative paths for the exhaust between the interior volume and the vacuum pump, and the first exhaust line has an internal diameter that is at least 50% smaller than the internal diameter of the second exhaust line.

In another embodiment, a plasma processing system for cleaning a substrate is provided. The plasma processing system includes a process chamber, comprising: a chamber body enclosing an interior volume; and a substrate support disposed in the interior volume. The plasma processing system can further include a gas source fluidly coupled to the interior volume; a first supply line fluidly coupled between the interior volume and the gas source; and a second supply line fluidly coupled between the interior volume and the gas source, wherein the first supply line and the second supply line are arranged to provide alternative paths between the interior volume and the gas source, and the first supply line has an internal diameter that is at least 50% smaller than the internal diameter of the second supply line.

In another embodiment, a cluster tool for processing a semiconductor substrate is provided. The cluster tool includes a transfer chamber; a deposition chamber coupled to the transfer chamber; and a plasma processing system coupled to the transfer chamber, the plasma processing system comprising: a process chamber comprising: a chamber body enclosing an interior volume; and a substrate support disposed in the interior volume; a vacuum pump; a first exhaust line fluidly coupled between the interior volume of the process chamber and the vacuum pump; and a second exhaust line fluidly coupled between the interior volume of the process chamber and the vacuum pump, wherein the first exhaust line and the second exhaust line are arranged to provide alternative paths for the exhaust between the interior volume and the vacuum pump, and the first exhaust line has an internal diameter that is at least 50% smaller than the internal diameter of the second exhaust line.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Figure 1:
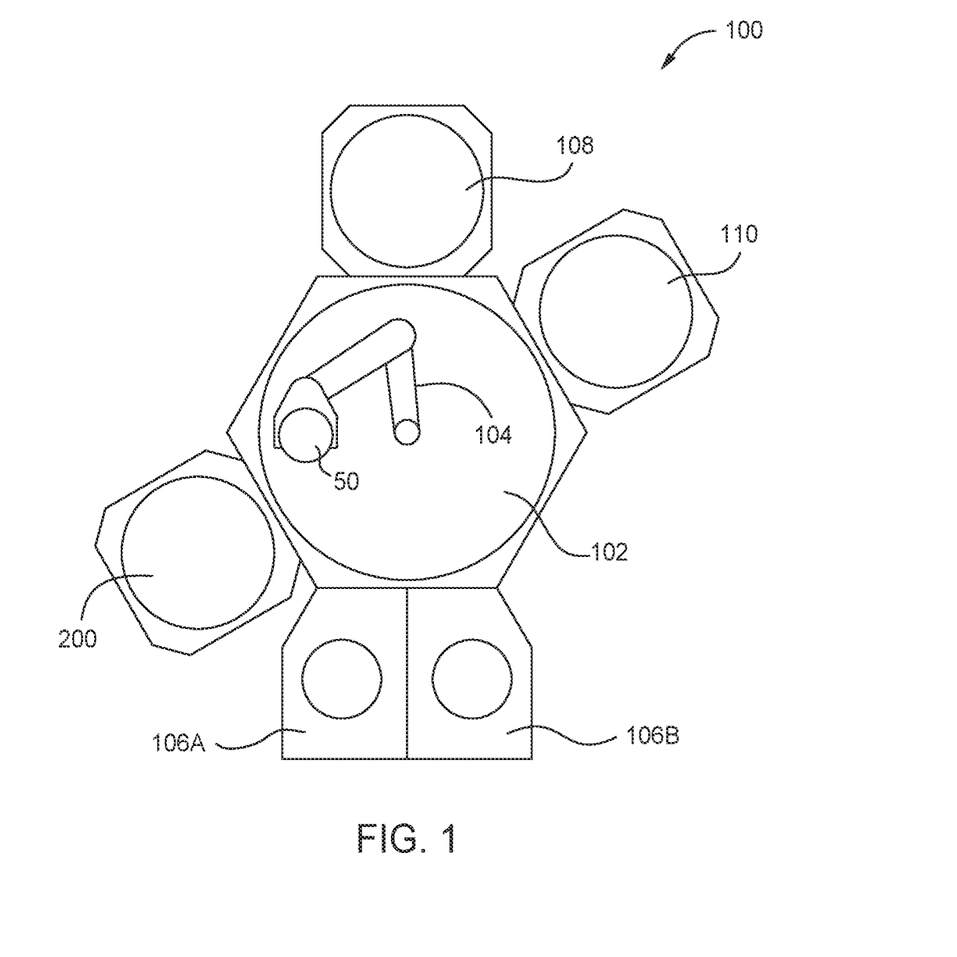
FIG. 1 is a schematic top view of a cluster tool that can be used to perform the processes described herein, according to one embodiment.

FIG. 1 is a schematic top view of a cluster tool 100 that can be used to perform the processes described herein, according to one embodiment. The cluster tool 100 includes a transfer chamber 102, a pair of load lock chambers 106A, 106B, a preclean system 200 (also referred to as processing system), and a pair of process chambers 108, 110. The transfer chamber 102 includes a transfer robot 104 that can transfer a substrate 50 to and from each part of the cluster tool 100.

As described in fuller detail below the preclean system 200 includes a number of features, which enable the preclean system 200 to perform a vacuum-pressure (e.g., 3 Torr), plasma preclean process on a substrate and then transfer the substrate to the transfer chamber 102 at atmospheric pressure or a pressure close to atmospheric pressure.

An overview of an exemplary process performed on a substrate 50 in the cluster tool is provided here. A substrate 50 can be received by the cluster tool 100 in one of the load lock chambers 106A, 106B. Then the substrate 50 can be transferred by the transfer robot 104 through the transfer chamber 102 and into the chamber of the preclean system 200 for a preclean process, such as removal of oxides on the substrate 50. Then, the substrate 50 can be transferred by the robot 104 through the transfer chamber 102 into one of the process chambers 108, 110, so that a process (e.g., an epitaxial deposition) can be performed on the substrate In some embodiments, a second process can be performed on the substrate 50 in the other process chamber 108, 110. After the processing in one or both of the process chambers 108, 110, the substrate 50 can then be transferred back by the transfer robot 104 through the transfer chamber 102 to one of the load lock chambers 106A, 106B for additional processing in other equipment (not shown).

The preclean system 200 can include a preclean chamber 201 (FIG. 2) configured to clean the substrate 50 prior to a process (e.g., an epitaxial deposition) to be performed on the substrate 50 in one of the process chambers 108, 110. In some embodiments, can include equipment for providing a plasma to the interior volume of the preclean chamber 201, so that the preclean process can be performed on the substrate 50. Depending on the embodiment, the preclean system can include one or more of a remote plasma source, a capacitively coupled plasma source, or an inductively coupled plasma source. The preclean system 200 can be used to perform the cleaning process described below.

In one embodiment, the process chambers 108, 110 can be epitaxial deposition chambers. The process chambers 108, 110 can be configured to perform epitaxial depositions at atmosphere pressure or pressures near atmosphere pressure (e.g., 700-800 Torr).

Figure 2:
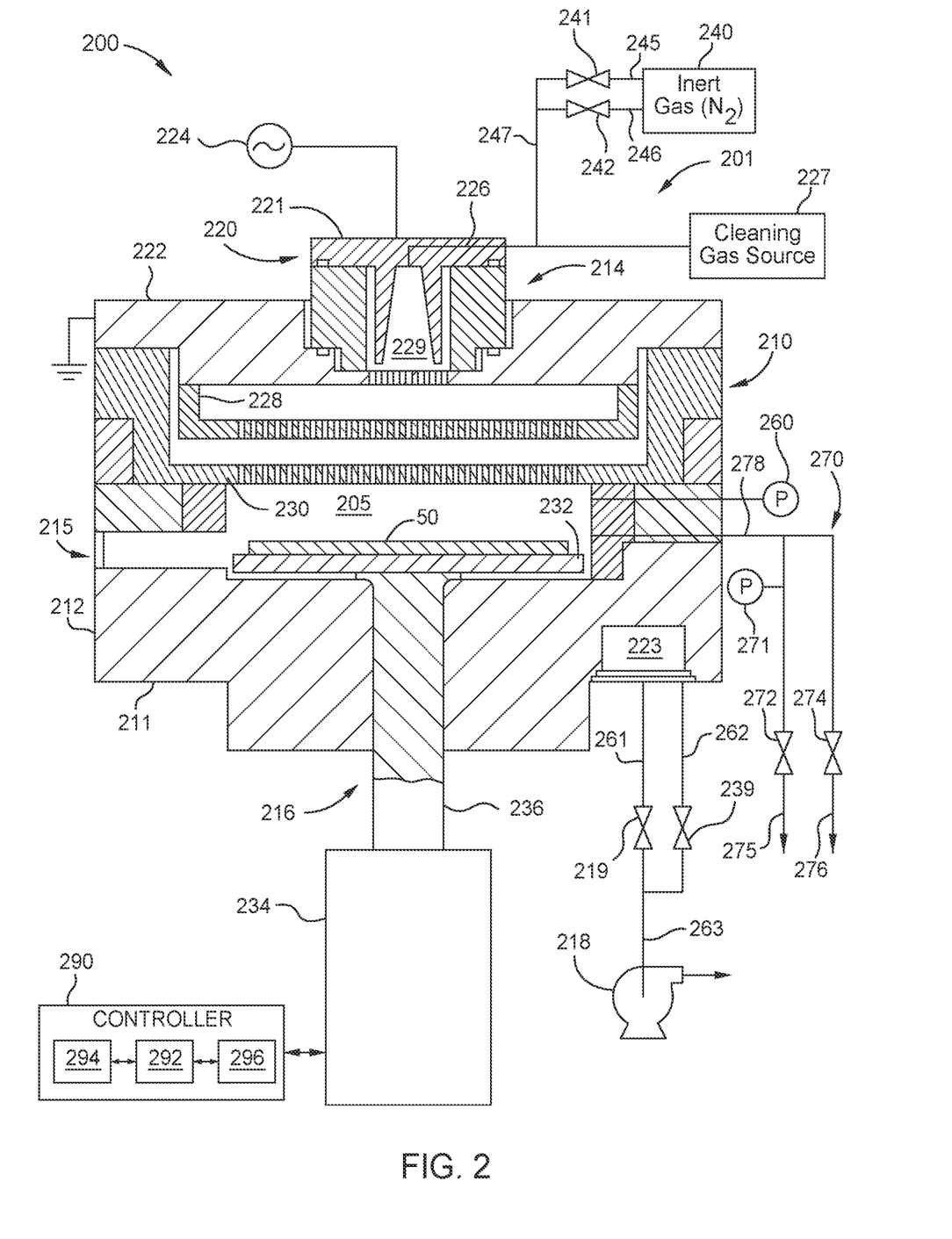
FIG. 2 is a cross-sectional view of the preclean system from the cluster tool of FIG. 1, according to one embodiment.

FIG. 2 is a cross-sectional view of the preclean system 200, according to one embodiment. The preclean system 200 includes a preclean chamber 201 (also referred to as a process chamber). The preclean chamber 201 includes a chamber body 210. The chamber body 210 includes a bottom 211, a lid assembly 214, and one or more chamber walls 212 connecting the bottom 211 with the lid assembly 214. The chamber body 210 can enclose an interior volume 205 of the preclean chamber 201.

The preclean chamber 201 further includes a substrate support assembly 216. The substrate support assembly 216 can include a substrate support 232, an actuator 234, and a shaft 236 connecting the actuator 234 with the substrate support 232. The substrate support 232 can be located in the interior volume 205 to support a substrate 50 during processing.

The chamber body 210 can further include a slit valve 215 to allow insertion and removal of a substrate 50 into and from the interior volume 205 of the preclean chamber 201. The preclean system 200 and cluster tool 100 can be configured to have a pressure in the interior volume 205 remain below a pressure in the transfer chamber 102 when the slit valve 215 is opened to prevent flow of gas and/or particles from the preclean chamber 201 to the transfer chamber 102 as described in further detail below.

The lid assembly 214 is disposed at an upper end of the chamber body 210. The lid assembly 214 can include a remote plasma source 220 for generating a plasma from cleaning gases provided to the remote plasma source 220. The cleaning gases can be provided from a cleaning gas source 227 through a gas inlet 226 of the preclean chamber 201. The cleaning gas source 227 can include a separate tank for each cleaning gas. In one embodiment, the cleaning gases from the cleaning gas source 227 can include one or more of hydrogen ($H_2$), nitrogen trifluoride ($NF_3$), and ammonia ($NH_3$). The remote plasma source 220 can include a first electrode 221 and a second electrode 222. The first electrode 221 can be spaced apart from the second electrode 222. The remote plasma source 220 can include a plasma-generating volume 229 positioned between the first electrode 221 and the second electrode 222.

The processing system 200 can include a radio frequency (RF) power source 224. The RF power source 224 can be connected to the first electrode 221. The second electrode 222 can be connected to electrical ground to serve as a return path for the RF power when the plasma is generated in the volume 229. The RF power source 224 can be used to generate a plasma of the cleaning gases inside plasma-generating volume 229 when the cleaning gases are provided to the remote plasma source 220.

The lid assembly 214 can further include a blocker plate 228 and a showerhead 230 for distributing gas and/or plasma to the interior volume 205 of the preclean chamber 201. The blocker plate 228 can be positioned between the remote plasma source 220 and the showerhead 230. The blocker plate 228 can receive plasma and/or gas discharged from the remote plasma source 220. In some embodiments, one or more gases may be provided directly to the blocker plate 228 or showerhead 230 allowing the remote plasma source 220 to be bypassed.

The processing system 200 can further include an inert gas source 240 connected to the preclean chamber 201. In one embodiment, the inert gas source 240 includes nitrogen, but in other inert gases (e.g., argon) may also be used. The inert gas can be used to pressurize the interior volume 205 of the preclean chamber 201 after a preclean process is performed on the substrate 50 and/or before a new substrate 50 is transferred into the preclean chamber 201. The processing system 200 can include a pressure sensor 260 configured to measure a pressure of the interior volume 205 of the process chamber 201.

The inert gas source 240 can be connected to the gas inlet 226 of the process chamber through a first supply line 245 or a second supply line 246 of the processing system 200. The first supply line 245 and the second supply line 246 can be connected to the gas inlet 226 through a common supply line 247. The first supply line 245 and the second supply line 246 can be arranged to form parallel (i.e., alternative) paths relative to each other, so that gas can be supplied to the preclean chamber 201 through one of the supply lines without going through the other supply line.

The first supply line 245 can include a first supply valve 241 that can be opened to connect the first supply line 245 with the common supply line 247. The second supply line 246 can include a second supply valve 242 that can be opened to connect the second supply line 246 with the common supply line 247.

The first supply line 245 can have a smaller internal diameter relative to the internal diameter of the second supply line 246. In some embodiments, the internal diameter of the first supply line 245 can be from about 5% to about 90%, such as from about 10% to about 50% of the internal diameter of the second supply line 246. The smaller diameter of the first supply line 245 can be used to slowly raise the pressure in the interior volume 205 from the vacuum pressures (e.g., 2-20 Torr, such as between about 3-5 Torr) used for the preclean process after a preclean process is performed on the substrate 50. On the other hand, the second supply line 246 can be used to quickly raise the pressure in the interior volume 205 back to atmospheric pressure or a pressure near atmospheric pressure after the pressure reaches a higher pressure (e.g., 300 Torr) from the gas provided from the smaller first supply line 245. Slowly raising the pressure after the preclean process can prevent the likelihood of damaging the substrate 50 from an abrupt pressure change, such as mechanical damage caused by a wobbling or otherwise unintentionally moving the substrate 50.

Using different supply lines with different internal diameters is one method of varying the rate at which gas is provided to the interior volume 205. In other embodiments, the slower pressure changes can be achieved, for example, with an analog control valve on a single supply line. In some of these other embodiments, a sensor, such as a flowmeter or pressure sensor can be used to control the analog control valve or other actuator (e.g., a variable-speed pump) in order to control the rate at which the pressure in the interior volume 205 increases when the inert gas is supplied to the interior volume 205, so that slower pressure changes in the interior volume 205 can be achieved.

The processing system 200 can further include a vacuum pump 218 configured to exhaust gas from the preclean chamber 201 through an exhaust port 223 of the preclean chamber 201. The vacuum pump 218 can be connected to the exhaust port 223 through a first exhaust line 261 or a second exhaust line 262 of the processing system 200. The first exhaust line 261 and the second exhaust line 262 can be arranged to form parallel (i.e., alternative) paths relative to each other, so that gas can be exhausted from the preclean chamber 201 through one of the exhaust lines without going through the other exhaust line. The first exhaust line 261 and the second exhaust line 262 can be connected to the exhaust port 223 through a common exhaust line 263. The first exhaust line 261 can include a first exhaust valve 219 that can be opened to fluidly couple the first exhaust line 261 with the common exhaust line 263. The second exhaust line 262 can include a second exhaust valve 239 that can be opened to fluidly couple the second exhaust line 262 with the common exhaust line 263.

The first exhaust line 261 can have a smaller internal diameter relative to the internal diameter of the second exhaust line 262. All references provided in this disclosure to internal diameters also apply to internal cross-sectional areas, for example if the component (e.g., a fluid conduit) has a non-circular cross-section. In some embodiments, the internal diameter of the first exhaust line 261 can be from about 5% to about 75%, such as from about 10% to about 50% of the internal diameter of the second exhaust line 262. The smaller diameter of the first exhaust line 261 can be used to smoothly and slowly lower the pressure in the interior volume 205 from atmospheric pressure or a pressure near atmospheric pressure (e.g., 700-800 Torr), to a lower pressure, such as from about 400-650 Torr, such as about 600 Torr. The pressure reduction can be performed, for example, after a substrate 50 is transferred into the preclean chamber 201 from the transfer chamber 102, which is maintained at atmospheric pressure or a pressure near atmospheric pressure. On the other hand, the second exhaust line 262 can be used to quickly lower the pressure in the interior volume 205 down to a pressure near the pressure used for the preclean plasma process, such as a pressure less than 50 Torr, such as about 100 mTorr to about 20 Torr, such as a pressure between about 300 mTorr and about 5 Torr). Slowly lowering the pressure after a substrate 50 is transferred into the preclean chamber 201 can prevent the likelihood of damaging the substrate from an abrupt pressure change, such as mechanical damage caused by wobbling or otherwise unintentionally moving the substrate 50.

Using different exhaust lines with different internal diameters is one method of varying the rate at which gas and/or plasma is exhausted from the interior volume 205, so that slower pressure changes in the interior volume 205 can be achieved. In other embodiments, the slower pressure changes can be achieved, for example, with an analog control valve on a single exhaust line. In some of these other embodiments, a sensor, such as a flowmeter or pressure sensor can be used to control the analog control valve or other actuator (e.g., a variable-speed vacuum pump) in order to control the rate at which the pressure in the interior volume 205 decreases when the interior volume 205 is brought down to a vacuum pressure for performing the plasma preclean process.

As introduced above, the substrate support assembly 216 includes the substrate support 232, the actuator 234, and the shaft 236 connecting the actuator 234 with the substrate support 232. The shaft 236 can extend through a centrally-located opening formed in the bottom 211 of the chamber body 210. The actuator 234 may be flexibly sealed to the bottom 211 of the chamber body 210 by bellows (not shown) that prevent vacuum leakage from around the shaft 236. The actuator 234 allows the substrate support 232 to be moved vertically within the chamber body 210 between a process position and a lower transfer position. The transfer position can be slightly below the opening of the slit valve 215 formed through one of the one or more walls 212 of the chamber body 210.

Although not shown, in some embodiments, an RF and/or DC bias can be coupled to the substrate support 232 to assist with directing the cleaning plasma toward the substrate 50.

The processing system 200 can further include an auxiliary exhaust assembly 270. The auxiliary exhaust assembly 270 can include a first auxiliary exhaust line 275, a second auxiliary exhaust line 276, and a common auxiliary exhaust line 278. The auxiliary exhaust assembly 270 can further include a vacuum pump or other device for creating a negative pressure in the auxiliary exhaust assembly 270 lines relative to the interior volume 205 of preclean chamber 201, so that gas is exhausted from the interior volume 205 through the auxiliary exhaust assembly 270 when the valves of the auxiliary exhaust assembly 270 are opened.

The common auxiliary exhaust line 278 can be connected to the interior volume 205 of the preclean chamber 201. The first auxiliary exhaust line 275 and the second auxiliary exhaust line 276 can be connected to the interior volume 205 of the preclean chamber 201 through the common auxiliary exhaust line 278. The first auxiliary exhaust line 275 can include a first auxiliary exhaust valve 272 that can be opened to connect the first auxiliary exhaust line 275 with the common auxiliary exhaust line 278. The second auxiliary exhaust line 276 can include a second auxiliary exhaust valve 274 that can be opened to connect the second auxiliary exhaust line 276 with the common auxiliary exhaust line 278.

The first auxiliary exhaust valve 272 can be opened when a high pressure condition occurs. The first auxiliary exhaust line 275 can include a pressure sensor 271 to measure a pressure inside the first auxiliary exhaust line 275. Upon measuring a pressure above a given threshold (e.g., 800 Torr), the first auxiliary exhaust valve 272 can be opened to relieve pressure inside the interior volume 205. Because the preclean chamber 201 is operated at a higher pressure than other preclean chambers that typically operate at vacuum pressures (e.g., less than 100 Torr) for the preclean process and substrate transfer, more components of the preclean chamber are fastened or otherwise secured to each other. For example, the components of the lid assembly 214 can be secured to other components in the lid assembly 214 and/or to the chamber walls 212. Some of these components in the lid assembly are generally unfastened for preclean chambers that operate at vacuum pressures for the preclean process and substrate transfer to and from the preclean chamber. The additional fastening of components in the preclean chamber 201 can help prevent movement of any of the components during the pressure changes that occur for each substrate preclean and transfer as described in further detail below. Securing these components though can create a safety issue as the previously unsecured components could move to relieve a high pressure situation. In the preclean chamber 201, the first auxiliary exhaust valve 272 can open to relieve a high pressure condition when measured by the pressure sensor 271 and prevent an unsafe high-pressure condition from occurring.

The second auxiliary exhaust valve 274 can be opened when the slit valve 215 is opened, which allows gas to flow from the interior volume 205 and out the auxiliary exhaust assembly 270. The interior volume 205 of the preclean chamber 201 is generally considered to be less clean than the interior volume of the transfer chamber 102. Thus, gas should not flow from the interior volume 205 of the preclean chamber 201 to the interior volume of the transfer chamber 102. Opening the second auxiliary exhaust valve 274 when the slit valve 215 opens reduces the pressure in the interior volume 205 relative to the pressure in the interior volume of the transfer chamber 102 and gas flows from the interior volume of the transfer chamber 102 through the interior volume 205 of the preclean chamber 201 and out through the auxiliary exhaust assembly 270.

The processing system 200 can also include a controller 290 for controlling processes within the processing system 200 (FIG. 2) and other portions of the cluster tool 100 (FIG. 1). The controller 290 can be any type of controller used in an industrial setting, such as a programmable logic controller (PLC). The controller 290 includes a processor 292, a memory 294, and input/output (I/O) circuits 296. The controller 290 can further include one or more of the following components (not shown), such as one or more power supplies, clocks, communication components (e.g., network interface card), and user interfaces typically found in controllers for semiconductor equipment.

The memory 294 can include non-transitory memory. The non-transitory memory can be used to store the programs and settings described below. The memory 294 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 292 is configured to execute various programs stored in the memory 294, such as a program configured to execute the method 1000 described below in reference to FIG. 3. During execution of these programs, the controller 290 can communicate to I/O devices (e.g., sensors and actuators) through the I/O circuits 296. For example, during execution of these programs and communication through the I/O circuits, the controller 290 can control outputs (e.g., open and close valves) and receive information from feedback devices (e.g., feedback on the open/close state of valves), sensors, and other instrumentation in the processing system 200 and other portions of the cluster tool 100.

The memory 294 can further include various operational settings used to control the processing system 200 and other portions of the cluster tool 100. For example, the settings can include pressure settings for when a transition between slowly changing and more quickly changing the pressure in the interior volume 205 is made in the method 1000 as described below in reference to FIG. 3 among various other settings.

Figure 3:
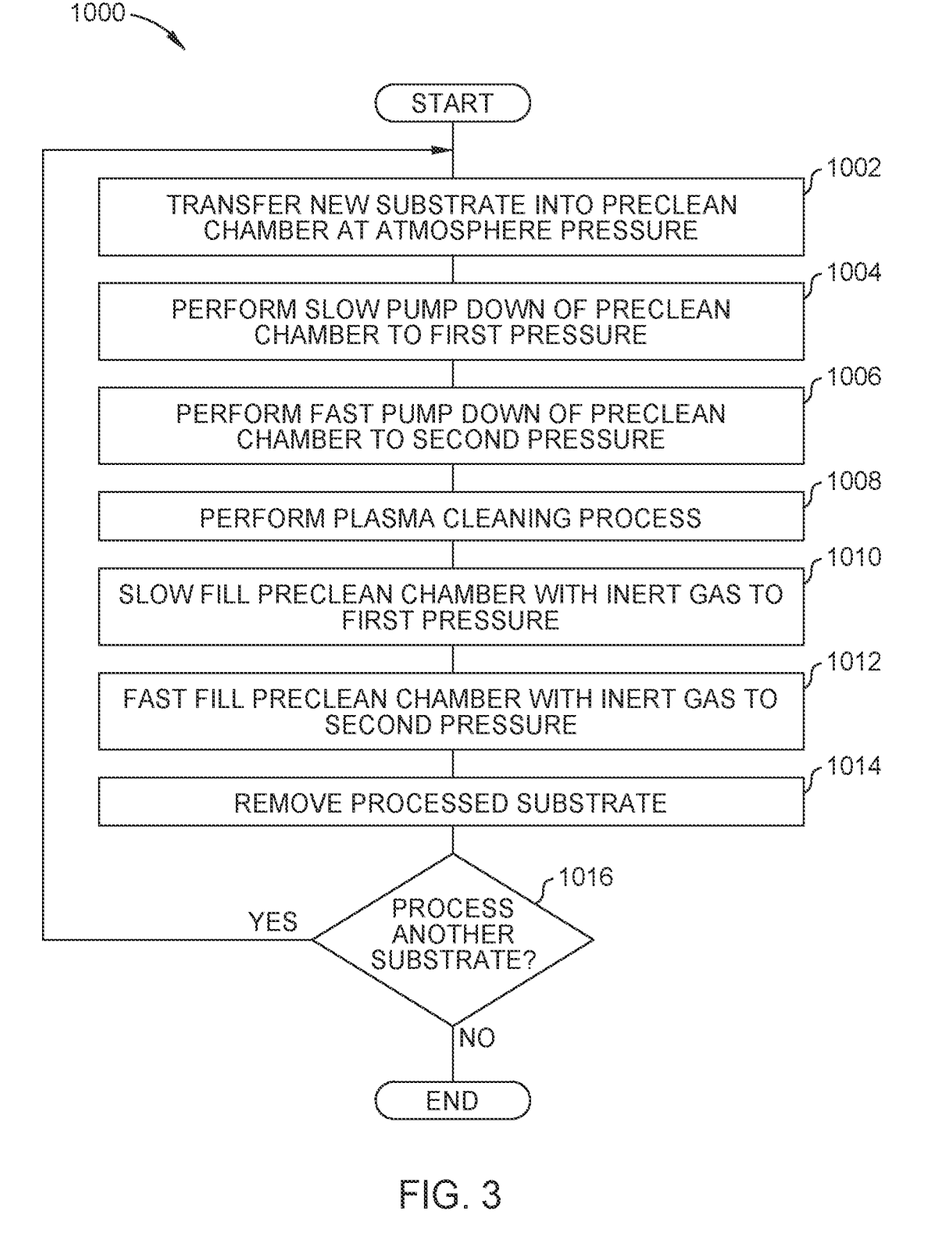
FIG. 3 is a process flow diagram of a method of performing a preclean process on a substrate, according to one embodiment.

FIG. 3 is a process flow diagram of a method 1000 of performing a preclean process on a substrate 50, according to one embodiment. The method 1000 is described in reference to FIGS. 1-3. The controller 290 can execute a program stored in memory to perform the method 1000. The method begins at block 1002.

At block 1002, a new substrate 50 is transferred into the preclean chamber 201 from the transfer chamber 102 of the cluster tool 100. At block 1002, the interior volume of the transfer chamber 102 and the interior volume 205 of the preclean chamber 201 are both at atmospheric pressure or close to atmospheric pressure. The slit valve 215 of the preclean chamber 201 can be opened, and the transfer robot 104 can position the substrate 50 on the substrate support 232 in the interior volume 205 of the preclean chamber 201. The second auxiliary exhaust valve 274 can be opened when the slit valve 215 is opened or slightly before the slit valve 215 is opened, which allows gas to flow from the interior of the transfer chamber 102 to the interior volume 205 of the preclean chamber 201 and out through the auxiliary exhaust assembly 270, which is connected to a low pressure outlet (not shown). Having the gas flow from the transfer chamber 102 to the preclean chamber 201 helps maintain a clean environment in the transfer chamber 102 and the rest of the cluster tool outside of the preclean chamber 201.

At block 1004, the slit valve 215 is closed and a slow pump down of the preclean chamber 201 is performed. When the slow pump down begins the interior volume 205 of the preclean chamber 201 is at atmospheric pressure or pressure close to atmospheric pressure. The slow pump down of the interior volume 205 is performed by energizing the vacuum pump 218 and opening the first exhaust valve 219. The slow pump down continues until a first target exhaust pressure in the interior volume 205 is reached as measured by the pressure sensor 260. In some embodiments, the first target exhaust pressure can be from about 400 Torr to about 700 Torr, such as about 600 Torr. The first exhaust valve 219 is located on the first exhaust line 261, which has a smaller internal diameter than the second exhaust line 262. The smaller diameter of the first exhaust line 261 can be used to smoothly and slowly lower the pressure in the interior volume 205 until the first target exhaust pressure is reached. In some embodiments, the slow pump down can take from about 5 seconds to about 100 seconds, such as about 20 seconds. The slow pump down helps prevent damage to the substrate 50 that could be caused by movement (e.g., wobbling or other unintentional movement) of the substrate 50 when the substrate 50 is exposed to an abrupt pressure change, for example if a faster pump down of the interior volume 205 was performed without first performing the slow pump down at block 1004.

At block 1006, a fast pump down of the interior volume 205 of the preclean chamber 201 is performed from the first target exhaust pressure reached at block 1004 (e.g., 600 Torr) to a lower target exhaust pressure as measured by the pressure sensor 260 for the preclean plasma process. The lower target exhaust pressure can be from about 100 mTorr to about 20 Torr, such as between about 300 mTorr to about 5 Torr. The fast pump down of the interior volume 205 is performed by opening the second exhaust valve 239 to connect the interior volume 205 of the vacuum pump 218 through the second exhaust line 262. The first exhaust valve 219 can be closed at block 1006. The second exhaust line 262 has a larger internal diameter (e.g., 100% larger) relative to the first exhaust line 261 enabling the pressure of the interior volume 205 to be reduced more rapidly relative to the pressure changes during the slow pump down of block 1004. In some embodiments, the fast pump down can take from about 3 seconds to about 50 seconds, such as about 10 seconds.

At block 1008, a plasma preclean process is performed on the substrate 50 in the interior volume 205 of the preclean chamber 201. The pre cleaning process can include providing one or more cleaning gases (e.g., $NF_3$, $NH$, and $H_2$) to the remote plasma source 220, generating a plasma of the one or more cleaning gases in the remote plasma source 220, and providing the plasma of the one or more cleaning gases to the interior volume 205 of the preclean chamber 201 through the showerhead 230 until the cleaning process at block 1008 is complete (e.g., after a designated period of time). In one embodiment, the plasma of the one or more cleaning gases can be used to remove oxides from the substrate 50.

At block 1010, after the cleaning process at block 1008 is complete, a slow fill of the interior volume 205 of the preclean chamber 201 with an inert gas (e.g., $N_2$) is performed. The plasma preclean process performed at block 1008 is performed at a vacuum pressure (e.g., 3 Torr). Thus, the slow fill process at block 1010 begins at the vacuum pressure at which block 1008 ended. The slow fill of the interior volume 205 of the preclean chamber 201 is performed by opening the first supply valve 241 on the first supply line 245, which connects the inert gas source 240 to gas inlet 226 of the preclean chamber 201 through the first supply line 245.

The slow fill at block 1010 continues until a first target supply pressure in the interior volume 205 is reached as measured by the pressure sensor 260. In some embodiments, the first target supply pressure can be from about 100 Torr to about 500 Torr, such as about 300 Torr. The first supply valve 241 is located on the first supply line 245, which has a smaller internal diameter than the second supply line 246. The smaller diameter of the first supply line 245 can be used to smoothly and slowly increase the pressure in the interior volume 205 until the first target supply pressure is reached. In some embodiments, the slow fill can take from about seconds to about 100 seconds, such as about 20 seconds. The slow fill helps prevent damage to the substrate 50 that could be caused by movement (e.g., wobbling or other unintentional movement) of the substrate 50 when the substrate is exposed to an abrupt pressure change, for example if a faster fill of the interior volume 205 was performed without first performing the slow fill at block 1010.

At block 1012, a fast fill of the interior volume 205 of the preclean chamber 201 is performed from the first target supply pressure reached at block 1010 (e.g., 200 Torr) to a higher second target supply pressure as measured by the pressure sensor 260. The higher second target supply pressure can be atmospheric pressure or a pressure close to atmospheric pressure. The fast fill of the interior volume 205 is performed by opening the second supply valve 242, which connects the inert gas source 240 to gas inlet 226 of the preclean chamber 201 through the second supply line 246.

The first supply valve 241 can be closed at block 1012. The second supply line 246 has a larger internal diameter (e.g., 100% larger) relative to the first supply line 245 enabling the pressure of the interior volume 205 to be increased more rapidly relative to the pressure changes during the slow fill at block 1010. In some embodiments, the fast fill can take from about 3 seconds to about 50 seconds, such as about 10 seconds.

At block 1014, with interior volume 205 at atmospheric pressure or pressure near atmospheric pressure, the substrate 50 can be removed from the preclean chamber 201. The slit valve 215 of the preclean chamber 201 can be opened, and the transfer robot 104 can remove the substrate 50 from the substrate support 232. The second auxiliary exhaust valve 274 can be opened when the slit valve 215 is opened or slightly before the slit valve 215 is opened, which allows gas to flow from the interior of the transfer chamber 102 to the interior volume 205 of the preclean chamber 201 and out through the auxiliary exhaust assembly 270, which is connected to a low pressure outlet (not shown). Having the gas flow from the transfer chamber 102 to the preclean chamber 201 helps maintain a clean environment in the transfer chamber 102 and other portions of the cluster tool 100 outside the preclean chamber 201.

After being removed from the preclean chamber 201 the precleaned substrate 50 can be transferred into one of the process chambers 108, 110, so that an additional process can be performed on the substrate 50, such as an epitaxial deposition performed at atmospheric pressure or a pressure close to atmospheric pressure.

At block 1016, a determination is made regarding whether the preclean process should be performed on another substrate 50. If another substrate 50 is to be precleaned, then blocks 1002 to 1014 can be repeated for the next substrate 50. This repetition can continue until a target number of substrates 50 are precleaned using the method 1000.

The equipment and processes described in this disclosure enable a vacuum pressure (e.g., 3 Torr), plasma preclean process to be performed on a substrate in a preclean chamber when the preclean chamber is connected to equipment operating at substantially higher pressures, such as atmospheric pressures. For example, the other portions of the cluster tool 100, such as the transfer chamber 102, the process chambers 108, 110, and the load lock chambers 106A, 106B can all operate at a substantially higher pressure, such as atmospheric pressure. By starting the pressure changes for the interior volume 205 of the preclean chamber 201 in a slow manner with the slow pump down at block 1004 and the slow fill at block 1010, and then increasing rate of pressure change for the interior volume 205 with the fast pump down at block 1006 and the fast fill at block 1012, numerous substrates 50 can be precleaned in a fast and efficient manner while the risk of damaging the substrates 50 (e.g., mechanical damage caused by wobbling or otherwise unintentionally moving the substrate) from abrupt pressure changes remains low.

While the foregoing is directed to implementations of the present disclosure, other and further implementations of the disclosure may be devised without departing from the basic scope thereof

The invention claimed is:

1. A plasma processing system for cleaning a substrate comprising:
    a process chamber, comprising:
        a chamber body enclosing an interior volume; and
        a substrate support disposed in the interior volume;
    a vacuum pump;
    a first exhaust line fluidly coupled between the interior volume of the process chamber and the vacuum pump;
    a second exhaust line fluidly coupled between the interior volume of the process chamber and the vacuum pump, wherein the first exhaust line and the second exhaust line are arranged to provide alternative paths for the exhaust between the interior volume and the vacuum pump, and the first exhaust line has an internal diameter that is at least 50% smaller than the internal diameter of the second exhaust line;

a first supply line fluidly coupled between the interior volume and a gas source; and a second supply line fluidly coupled between the interior volume and a gas source, wherein the first supply line and the second supply line are arranged to provide alternative paths between the interior volume and the gas source, and the first supply line has an internal diameter that is at least 50% smaller than an internal diameter of the second supply line; and a controller configured to:

receive a substrate on the substrate support at a beginning of a first time period;

open a first exhaust valve on the first exhaust line to reduce a pressure in the interior volume and exhaust the interior volume of the process chamber through the first exhaust line until a first exhaust pressure in the interior volume is reached during the first time period;

open a second exhaust valve on the second exhaust line to further reduce the pressure to exhaust the interior volume of the process chamber through the second exhaust line until a second exhaust pressure in the interior volume is reached during the first time period;

perform an initial process on the substrate in the interior volume of the process chamber during the first time period after the second exhaust pressure is reached, wherein the first exhaust pressure is greater than 400 Torr;

open a first supply valve on the first supply line to provide a gas from the gas source to the interior volume of the process chamber through the first supply line until a first supply pressure in the interior volume is reached; and open a second supply valve on the second supply line to provide the gas from the gas source to the interior volume of the process chamber through the second supply line until a second supply pressure in the interior volume is reached, wherein the first supply pressure is less than 300 Torr.

2. The plasma processing system of claim 1, wherein the second exhaust pressure is less than 50 Torr.

3. The plasma processing system of claim 1, further comprising a remote plasma source fluidly coupled between the first supply line and the interior volume.

4. The plasma processing system of claim 1, wherein the second supply pressure is greater than 600 Torr.

5. A plasma processing system for cleaning a substrate comprising:

a process chamber, comprising:
  a chamber body enclosing an interior volume; and
  a substrate support disposed in the interior volume;
a gas source fluidly coupled to the interior volume;
a first supply line fluidly coupled between the interior volume and the gas source;
a second supply line fluidly coupled between the interior volume and the gas source, wherein the first supply line and the second supply line are arranged to provide alternative paths between the interior volume and the gas source, and the first supply line has an internal diameter that is at least 50% smaller than the internal diameter of the second supply line; and a controller configured to:

perform a process on a substrate disposed on the substrate support in the interior volume of the process chamber during a first time period;

open a first supply valve on the first supply line to increase a pressure in the interior volume and provide a gas from the gas source to the interior volume of the process chamber through the first supply line until a first supply pressure in the interior volume is reached during the first time period;

open a second supply valve on the second supply line to further increase a pressure in the interior volume and provide the same gas from the gas source to the interior volume of the process chamber through the second supply line until a second supply pressure in the interior volume is reached during the first time period; and remove the substrate from the process chamber during the first time period after the second supply pressure is reached.

6. The plasma processing system of claim 5, wherein the first supply pressure is less than 300 Torr.

7. The plasma processing system of claim 6, wherein the second supply pressure is greater than 600 Torr.

8. The plasma processing system of claim 5, further comprising a remote plasma source fluidly coupled between the first supply line and the interior volume.

9. A cluster tool for processing a semiconductor substrate, comprising:

a transfer chamber;
a deposition chamber coupled to the transfer chamber; and
a plasma processing system coupled to the transfer chamber, the plasma processing system comprising:
  a process chamber comprising:
    a chamber body enclosing an interior volume; and
    a substrate support disposed in the interior volume;
  a vacuum pump;
  a first exhaust line fluidly coupled between the interior volume of the process chamber and the vacuum pump;
  a second exhaust line fluidly coupled between the interior volume of the process chamber and the vacuum pump, wherein
    the first exhaust line and the second exhaust line are arranged to provide alternative paths for the exhaust between the interior volume and the vacuum pump, and
    the first exhaust line has an internal diameter that is at least 50% smaller than the internal diameter of the second exhaust line,
  a gas source fluidly coupled to the interior volume;
  a first supply line fluidly coupled between the interior volume and the gas source;
  a second supply line fluidly coupled between the interior volume and the gas source, wherein
    the first supply line and the second supply line are arranged to provide alternative paths between the interior volume and the gas source, and
    the first supply line has an internal diameter that is at least 50% smaller than an internal diameter of the second supply line; and a controller configured to:
receive a substrate on the substrate support at a beginning of a first time period;
open a first exhaust valve on the first exhaust line to reduce a pressure in the interior volume and exhaust the interior volume of the process chamber through the first exhaust line until a first exhaust pressure in the interior volume is reached during the first time period;
open a second exhaust valve on the second exhaust line to further reduce the pressure to exhaust the interior volume of the process chamber through the second exhaust line until a second exhaust pressure in the interior volume is reached during the first time period; and
perform an initial process on the substrate in the interior volume of the process chamber during the first time period after the second exhaust pressure is reached, wherein the first exhaust pressure is greater than 400 Torr;
open a first supply valve on the first supply line to provide a gas from the gas source to the interior volume of the process chamber through the first supply line until a first supply pressure in the interior volume is reached; and
open a second supply valve on the second supply line to provide the gas from the gas source to the interior volume of the process chamber through the second supply line until a second supply pressure in the interior volume is reached, wherein the first supply pressure is less than 300 Torr.

10. The cluster tool of claim 9, wherein the second exhaust pressure is less than 50 Torr.

11. The cluster tool of claim 9, wherein the controller is configured to operate the transfer chamber at atmospheric pressure.

12. The cluster tool of claim 9, wherein the controller is configured to perform a cleaning process on a substrate in the process chamber at a pressure from about 300 mTorr to about 20 Torr.

* * * * *